United States Patent [19]
Umeki

[11] Patent Number: 5,124,581
[45] Date of Patent: Jun. 23, 1992

[54] EMITTER-COUPLED LOGIC OUTPUT CIRCUIT

[75] Inventor: Yoshitaka Umeki, Tokyo, Japan

[73] Assignee: NEC Corporation, Tokyo, Japan

[21] Appl. No.: 763,631

[22] Filed: Sep. 23, 1991

[30] Foreign Application Priority Data

Sep. 25, 1990 [JP] Japan .................. 2-254464

[51] Int. Cl.$^5$ ............................................ H03K 19/00
[52] U.S. Cl. .................................. 307/446; 307/455; 307/475
[58] Field of Search .............. 307/443, 445, 446, 454, 307/455, 456, 475, 494

[56] References Cited

U.S. PATENT DOCUMENTS

| | | | |
|---|---|---|---|
| 4,835,420 | 5/1989 | Rosky | 307/446 X |
| 5,003,199 | 3/1991 | Chuang et al. | 307/446 |
| 5,006,731 | 4/1991 | Denda | 307/446 X |
| 5,023,479 | 6/1991 | Jeffery et al. | 307/446 |
| 5,047,670 | 9/1991 | Tran | 307/475 |
| 5,059,827 | 10/1991 | Phan et al. | 307/446 X |
| 5,066,876 | 11/1991 | Fukuda et al. | 307/475 |

*Primary Examiner*—Robert J. Pascal
*Attorney, Agent, or Firm*—Laff, Whitesel, Conte & Saret

[57] ABSTRACT

An ECL output circuit comprises a current-switching type logic circuit formed by differentially connected first and second bipolar transistors whose common emitters are connected to a lower potential power supply, and an emitter follower circuit formed by a third bipolar transistor whose collector is connected to a higher potential power supply and whose base is connected to a collector of one of the first and second bipolar transistors. The ECL output circuit further comprises a first N-type MOS transistor having a source connected to the lower potential power supply, and a gate and a drain commonly connected to the higher potential power supply through a resistor and to a collector of the other one of the first and second bipolar transistors through a capacitor, and a second N-type MOS transistor having a gate connected to the gate of the first MOS transistor, a source connected to the lower potential power supply, and a drain connected to the emitter of the third bipolar transistor. The circuit enables the discharging current of an output load to be increased only in the falling period of the output thereby realizing the high-speed operation, and where no logical change occurs, a very small constant-current flows in the circuit resulting in low power consumption.

6 Claims, 2 Drawing Sheets

EMITTER-COUPLED LOGIC OUTPUT CIRCUIT

BACKGROUND OF THE INVENTION

1. Field of the Invention

The present invention relates to an emitter coupled logic (hereinafter referred to as "ECL") output circuit.

2. Description of the Related Art

An ECL circuit has been conventionally known as an integrated circuit which has a function of an extra high speed logic operation, and has been widely used as an output device particularly for a computer, a communication appliance, etc.

FIG. 1 shows such a conventional ECL output circuit. Here, if an input signal having an "H" level, which is higher than a reference potenial at a reference terminal 2, is applied to an input terminal 1, a transistor $Q_1$ is turned on, but a transistor $Q_2$ is turned off, so that no current flows through a load resistor $R_2$. Accordingly, assuming that a potential of a higher potential supply terminal 5 is 0 V, and that a base-emitter forward voltage $V_{BEQ3}$ of a transistor $Q_3$ is 0.8 V, then a potential $V_3$ of an output terminal 3 becomes as follows.

$$\begin{aligned} V_3 &= V_{OH} \\ &= V_5 - V_{BEQ3} \\ &= -0.8 \, (V) \end{aligned} \quad (1)$$

The potential $V_3$ shows an "H" level.

Next, when an input signal of an "L" level, which is lower than the reference potential at the reference terminal 2, is applied to the input terminal 1, the transistor $Q_1$ is turned off, while the transistor $Q_2$ is turned on. Accordingly, assuming that a current $I_4$ of a constant-current source 4 is 0.2 mA, and that the load resistor $R_2$ is 3 kΩ, then the potential $V_3$ at the output terminal 3 becomes as follows.

$$\begin{aligned} V_3 &= V_{OL} \\ &= V_5 - I_4 \cdot R_2 - V_{BEQ3} \\ &= -1.4 \, (V) \end{aligned} \quad (2)$$

Thus, the potential $V_3$ shows an "L" level.

Generally, the reference potential at the reference potential 2 is set to $-1.1$ V in the circuit shown in FIG. 1.

Here, if a potential $V_6$ at a lower potential supply terminal 6 is equal to $-4.5$ V, a power consumption $P_{CS}$ of the current-switching type logic circuit becomes as follows.

$$\begin{aligned} P_{CS} &= |V_6| \cdot I_4 \\ &= 0.9 \, (mW) \end{aligned} \quad (3)$$

Further, in the case where a resistance $R_4$ is selected to be 15.5 kΩ, a power comsumption $P_{EF}$ of the emitter follower circuit, that is, the ECL output circuit is expressed as follows.

When the output terminal 3 is in the "H" level:

$$I_{R4(H)} = (V_{OH} - V_6)/R_4 = 0.24 \, (mA) \quad (4)$$

$$P_{EF(H)} = |V_6| \cdot I_{R4(H)} = 1.08 \, (mW) \quad (5)$$

When the output 3 is in the "L" level:

$$I_{R4(L)} = (V_{OL} - V_6)/R_4 = 0.20 \, (mA) \quad (6)$$

$$P_{EF(L)} = |V_6| \cdot I_{R4(L)} = 0.9 \, (mW) \quad (7)$$

Further, in FIG. 1, $C_L$ represents a load capacitance at the output terminal 3.

An integrated circuit having ECLs as basic circuits is constituted by a number of such circuits as shown in FIG. 1. Accordingly, as circuit integration is progressed, power consumption increases. It is, however, impossible to increase the power consumption limitlessly in view of the limitation in system power consumption, in junction temperature of the device, etc. Accordingly, it is necessary to reduce the power consumption in the ECL basic circuit shown in FIG. 1.

The reduction of power consumption means to decrease the current $I_4$ in the above equation (3) and the currents $I_{R4(H)}$ and $I_{R4(L)}$ in the equations (5) and (7). Accordingly, the reduction of power consumption deteriorates the high-seed operation which is the largest advantage of the ECL circuit. Specifically, if the current $I_{R4(L)}$ is made small, that is, the resistance value of the resistor $R_4$ is made high, the operation speed remarkably deteriorates in the falling change period of the output signal at the output terminal 3.

Assuming that the value of a load capacitance $C_L$ is 1 pF, the respective falling change periods of time of the output become as follows in the respective cases of $R_4 = 15.5$ kΩ and $R_4 = 31$ kΩ.

$$\begin{aligned} t &= -C_L \cdot R_4 \cdot \ln\left(\frac{V_2 - V_6}{V_{OH} - V_6}\right) \\ &= 1.31 \, (nsec) \, (R_4 = 15.5 \, k\Omega) \quad (8) \\ &= 2.62 \, (nsec) \, (R_4 = 31 \, k\Omega) \quad (9) \end{aligned}$$

Further, as apparent from the above equations (5) and (7), the power consumption $P_{EF(H)}$ in the "H" level period at the output terminal 3 is larger than the power consumption $P_{EF(L)}$ in the "L" level period at the same terminal output 3. It is better for the power consumption $P_{EF(H)}$ to be smaller in the high-speed operation of the ECL circuit. The conventional circuit as shown in FIG. 1 had the disadvantage that the power consumption was wasted because the power consumption $P_{EF(H)}$ was large.

SUMMARY OF THE INVENTION

It is, therefore, an object of the invention to overcome the problems existing in the conventional circuit and to provide an improved ECL output circuit.

It is another object of the invention to provide an ECL output circuit in which power consumption can be effectively reduced.

In order to attain the above object, according to one aspect of the present invention, there is provided an ECL output circuit having an input terminal, a reference potential terminal, an output terminal, a constant-current source, a higher potential supply terminal, a lower potential supply terminal, a resistor, and a capacitor, the ECL output circuit comprises:

a first NPN bipolar transistor having a base connected to the input terminal and an emitter connected to the lower potential supply terminal through the constant-current source;

a second NPN bipolar transistor having a base connected to the reference potential terminal and an emitter connected to the lower potential supply terminal through the constant-current source;

a third NPN bipolar transistor having a collector connected to the higher potential supply terminal, an emitter connected to the output terminal, and a base connected to a collector of one of the first and second bipolar transistors;

a first N-type MOS transistor having a source connected to the lower potential supply terminal, and a gate and a drain which are connected commonly to the higher potential supply terminal through the resistor and to a collector of the other one of the first and second bipolar transistors through the capacitor; and a second N-type MOS transistor having a gate connected to the gate of the first N-type MOS transistor, a source connected to the lower potential supply terminal, and a drain connected to the emitter of the third bipolar transistor.

If desired, a plurality of third N-type MOS transistors each having the same configuration as that of the second N-type MOS transistor may be connected in parallel to the second N-type MOS transistor in accordance with an increase of a load capacitance loaded on the output terminal.

Further, a second lower potential supply terminal whose potential is higher than that of the first power potential supply terminal may be provided. In this case, the respective sources of the first and second N-type MOS transistors are connected to this second lower potential supply terminal instead of the first lower potential supply terminal.

BRIEF DESCRIPTION OF THE DRAWINGS

The above and other objects, features and advantages of the present invention will be apparent from the following description of preferred embodiments of the invention explained with reference to the accompanying drawings, in which.

DETAILED DESCRIPTION OF PREFERRED EMBODIMENTS

Figure 1:
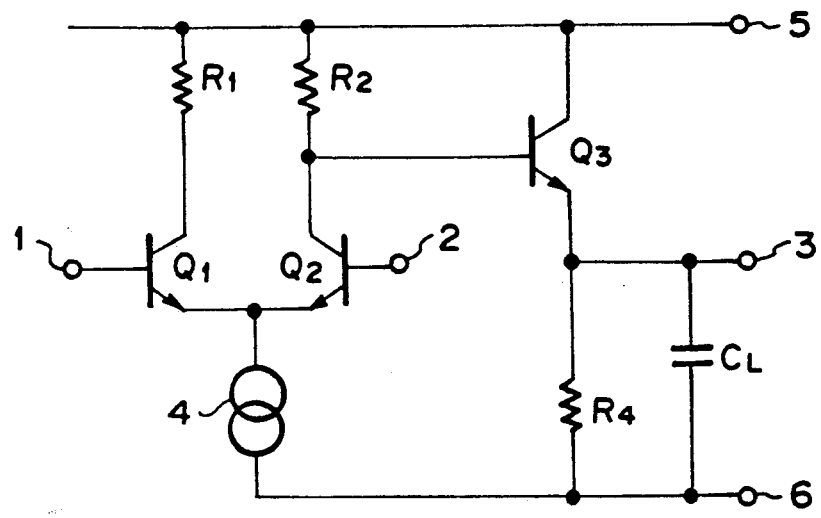
FIG. 1 is a circuit diagram showing a conventional ECL output circuit.

Referring to the drawings, embodiment of the present invention will be described hereunder.

It should be noted that, throughout the following description, similar or like reference symbols or numerals refer to the same or like elements in all the figures of the drawings.

Figure 2:
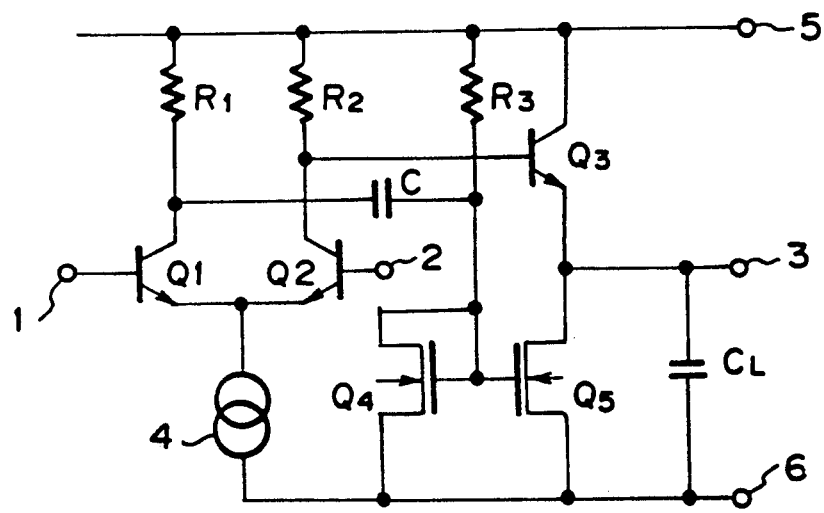
FIG. 2 is a circuit diagram showing a first embodiment of the ECL output circuit according to the invention.

FIG. 2 is a circuit diagram showing a first embodiment of the ECL output circuit according to the present invention. The circuit of this embodiment is different from that of FIG. 1 in that N-type MOS transistors $Q_4$ and $Q_5$, a resistor $R_3$ and a capacitor C are provided as shown in FIG. 2 in place of the resistor $R_4$ shown in FIG. 1.

Specifically, the N-type MOS transistor $Q_4$ has a source connected to the lower potential supply terminal 6, and a gate and a drain connected with each other. The tied gate and drain of the MOS transistor $Q_4$ are connected to the higher potential supply terminal 5 through the resistor $R_3$ and are also coupled to the collector of the bipolar transistor $Q_1$ through the capacitor C. The N-type MOS transistor $Q_5$ has a gate connected to the gate of the MOS transistor $Q_4$, a source connected to the lower potential supply terminal 6, and a drain connected to the emitter of the bipolar tansistor $Q_3$ and the output terminal 3.

Here, a drain-source current $I_{DS}$ of an MOS transistor is expressed in the following equation (10).

$$I_{DS} = k(V_G - V_T)^2 - k(V_G - V_D - V_T)^2 \qquad (10)$$

In the equation (10), $V_G$ represents a gate voltage, $V_T$ represents a threshold voltage, $V_D$ represents a drain voltage, and k is as follows:

$$k = \frac{1}{2} \cdot \mu_n \cdot C_{ox} \cdot \frac{W}{L'}$$

where $\mu_n$ represents the mobility of electron, $C_{ox}$ represents capacitance of gate oxide film, W represents gate width, and L' represents effective gate length.

In FIG. 2, since the gate and drain of the transistor $Q_4$ are shorted with each other, the transistor $Q_4$ operates in a saturation state. Accordingly, the equation (10) for the drain-source current of the transistor $Q_4$ is expressed as follows:

$$I_{DSQ4} = k(V_{GQ4} - V_{TQ4})^2 \qquad (11)$$

That is, a constant-current is constituted by the transistor $Q_4$ and the resistor $R_3$.

Further, a current mirror circuit is constituted by the transistor $Q_4$, the resistor $R_3$, and the transistor $Q_5$. From the equation (10), a drain-source current $I_{DSQ5}$ of the transistor $Q_5$ is expressed as follows:

$$I_{DSQ5} = k(V_{GQ5} - V_{TQ5})^2 - k(V_{GQ5} - V_{DQ5} - V_{TQ5})^2 \qquad (12)$$

Assuming that $V_{GQ5} = V_{GQ4} = V_G$, and that the transistors $Q_4$ and $Q_5$ have the same configuration, the condition of $V_{TQ5} = V_{TQ4} = V_T$ is established.

From the above equation (11), the following equation (13) can be led.

$$(V_G - V_T) = \sqrt{\frac{I_{DSQ4}}{k}} \qquad (13)$$

Substituting the equations (13) and (11) for the equation (12), the following equation (14) is obtained.

$$I_{DSQ5} = I_{DSQ4} - k\left(\sqrt{\frac{I_{DSQ4}}{k}} - V_{DQ5}\right)^2 \qquad (14)$$

Accordingly, the mirror coefficient M is expressed as follows.

$$M = \frac{I_{DSQ5}}{I_{DSQ4}} = 1 - \left(1 - \frac{V_{DQ5}}{\sqrt{\frac{I_{DSQ4}}{k}}}\right)^2 \quad (15)$$

The point where the mirror coefficient M becomes 1 is as follows.

$$\sqrt{\frac{I_{DSQ4}}{k}} = V_{DQ5} \quad (16)$$

Here, if the transistors $Q_4$ and $Q_5$ are so set that $k = 62 \times 10^{-6}$ (A), and if the transistor $Q_4$ and the resistor $R_3$ are so set that $I_{DSQ4} = 0.1$ (mA), the following equation (17) is obtained by substituting the above values in the equation (16).

$$\sqrt{\frac{I_{DSQ4}}{k}} = 1.27 \, (V) \quad (17)$$

That is, if the voltage across the drain-source circuit of the transistor $Q_5$ is higher than 1.27 V, the transistor $Q_5$ operates in the saturation state and a constant current of $I_{DSQ5} = I_{DSQ4} = 0.1$ mA flows in the transistor $Q_5$.

In FIG. 2, the potential at the lower potential supply terminal 5 is generally set to $-4.5$ V, and the voltage across the drain-source circuit of the transistor $Q_5$ is always maintained at a value not lower than 1.27 V as is apparent from the above equations (1) and (2).

Next, consideration is made on the effects of provision of the capacitor C. When the level of the input terminal 1 changes from "L" to "H", the transistor $Q_1$ is turned on, so that the potential at the collector of the transistor $Q_1$ falls. Here, the potentials at the gate and the drain of the transistor $Q_4$ and the potential at the gate of the transistor $Q_5$ are made to fall momentarily by the capacitor C. Accordingly, both the currents $I_{DSQ4}$ and $I_{DSQ5}$ decrease momentarily. At this time, the potential at the output terminal 3 changes so as to rise up, so that the reduction of the current $I_{DSQ5}$ is advantageous to the high-speed operation of the circuit.

On the other hand, when the level of the input terminal 1 changes from "H" to "L", the transistor $Q_1$ is turned off so that the potential at the collector of the transistor $Q_1$ rises. Here, the potentials at the gate and the drain of the transistor $Q_4$ and the potential at the gate of the transistor $Q_5$ are made to rise up momentarily by the capacitor C. Accordingyly, both the currents $I_{DSQ4}$ and $I_{DSQ4}$ increase momentarily. At this time, the potential of the output terminal 3 changes so as to fall, so that the increase of the current $I_{DSQ5}$ is advantageous to the high-speed operation of the circuit.

For example, where the current $I_{DSQ4}$ is made to be 0.2 mA by the capacitor C, the drain voltage of the transistor $Q_5$ is expressed as $$\sqrt{\frac{I_{DSQ4}}{k}} = 1.80 \, (V) \quad (18)$$

and, therefore, the transistor $Q_5$ operates in the saturation state, so that the condition of $I_{DSQ5} = I_{DSQ4} = 0.2$ mA is established. Assuming that the value of the load capacitance $C_L$ is 1 pF, the respective falling change periods of time of the output potentials become as follows in the respective cases of $I_{DSQ5} = 0.1$ mA and $I_{DSQ5} = 0.2$ mA.

$$t = v \cdot C/I = (0.3 \, (V) \times 1(pF))/I_{DSQ5}$$
$$= 3.0 \, (nsec) \, (I_{DSQ5} = 0.1 \text{mA}) \quad (19)$$
$$= 1.5 \, (nsec) \, (I_{DSQ5} = 0.2 \text{mA}) \quad (20)$$

The current changes in the $I_{DSQ4}$, $I_{DSQ5}$ occur momentarily only while the input potential changes, so that the provision of the capacitor C causes almost no increase in the power consumption.

Figure 3:
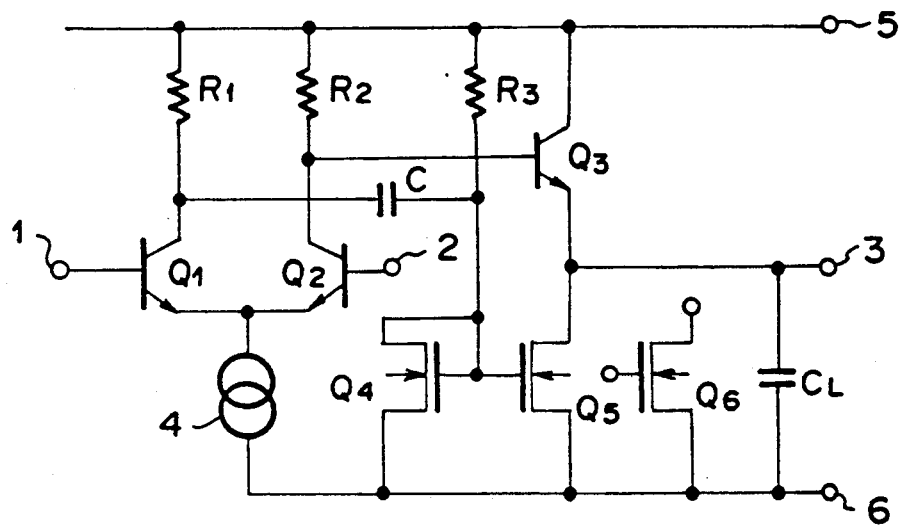
FIG. 3 is a circuit diagram showing a second embodiment of the ECL output circuit according to the invention.

FIG. 3 is a circuit diagram showing a second embodiment of the present invention. The second embodiment is different from the first embodiment in that a plurality of transistors (only one transistor $Q_6$ being representatively illustrated in the figure) each having the same configuration as that of the transistor $Q_5$. For example, in the case where the load capacitance $C_L$ has a large value, the gate, drain and source of one or more of the transistors $Q_6$ are connected to the gate, drain and source of the transistor $Q_5$, respectively, so that the falling change period of time of the potential at the output terminal 3 can be shortened. The source of the transistor $Q_6$ may be connected to the source of the transistor $Q_5$ in advance. In FIG. 3, although the parallel connection of the transistor $Q_6$ to the transistor $Q_5$ causes an increase in the power consumption, the falling change period of time can be halved.

Figure 4:
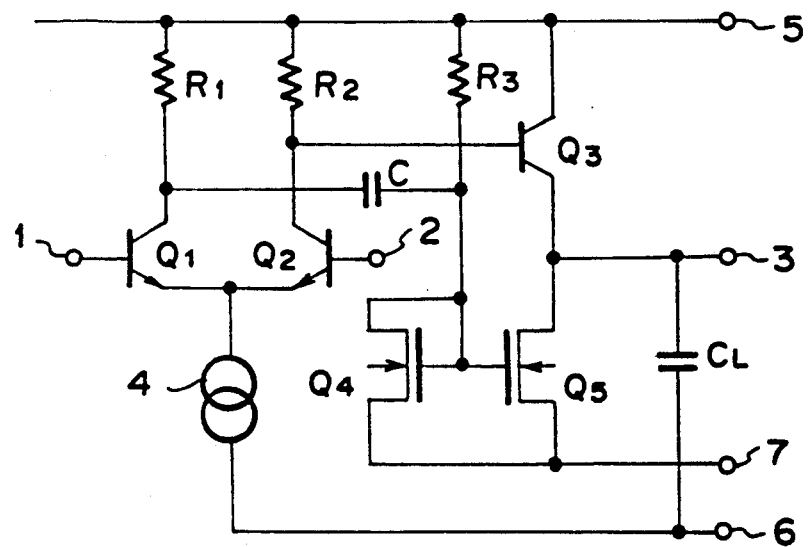
FIG. 4 is a circuit diagram showing a third embodiment of the ECL output circuit according to the invention.

FIG. 4 shows a third embodiment of the present invention, in which a second lower potential supply terminal 7 is additionally provided in the circuit of FIG. 2, whose potential is higher than that of the first lower potential supply terminal 6, and the sources of the transistors $Q_4$ and $Q_5$ are connected to the second lower supply terminal 7. The power consumption in this embodiment can be reduced in comparison with that in the FIG. 2 circuit.

Assume that the transistors $Q_4$ and $Q_5$, the resistor $R_3$, and the capacitor C are selected to have the same values as those in FIG. 2. Then, in the case where the transistor $Q_5$ is to be always used in the saturation state, the necessary potential $V_7$ at the second lower potential supply terminal 7 is expressed by the following equation (21):

$$\sqrt{\frac{I_{DSQ4}}{k}} = 1.80 \, (V) = V_{OL} - V_7 \quad (21)$$
$$= -1.4 \, (V) - V_7$$
$$\text{Thus, } V_7 = -3.2 \, (V)$$

Accordingly, it is necessary to set the voltage $V_7$ to be a value lower than $-3.2$ V.

As described above, according to the present invention, N-type MOS transistors, a resistor and a capacitor are additionally provided in an output portion of an emitter follower circuit in an ECL circuit, so that a discharging current of an output load capacitance is increased only in the falling period of the output potential thereby to realize high-speed operation, and in the case where no logical change occurs, a very small constant-current is caused to flow in the circuit so that low power consumption can be realized.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An ECL output circuit having an input terminal, a reference potential terminal, an output terminal, a constant-current source, a higher potential supply terminal, a lower potential supply terminal, a resistor, and a capacitor, said output circuit comprising:
- a first bipolar transistor having a base connected to said input terminal and an emitter connected to said lower potential supply terminal through said constant-current source;
- a second bipolar transistor having a base connected to said reference potential terminal and an emitter connected to said lower potential supply terminal through said constant-current source;
- a third bipolar transistor having a collector connected to said higher potential supply terminal, an emitter connected to said output terminal, and a base connected to a collector of one of said first and second bipolar transistors;
- a first one-conductivity type MOS transitor having a source connected to said lower potential supply terminal, and a gate and a drain which are connected commonly to said higher potential supply terminal through said resistor and to a collector of the other one of said first and second bipolar transistors through said capacitor; and
- a second one-conductivity type MOS transistor having a gate connected to the gate of said first one-conductivity type MOS transistor, a source connected to said lower potential supply terminal, and a drain connected to the emitter of said third bipolar transistor.

2. An ECL output circuit according to claim 1, in which a plurality of third one-conductivity type MOS transistors each having the same configuration as that of said second one-conductivity type MOS transistor are connected in parallel to said second one-conductivity type MOS transistor in accordance with an increase of a load capacitance at said output terminal.

3. An ECL output circuit according to claim 1, in which said first to third bipolar transistors are of an NPN-type, and said first and second one-conductivity type MOS transistors are of an N-type.

4. An ECL output circuit according to claim 2, in which said third one-conductivity type MOS transistors are of an N-type.

5. An ECL output circuit having an input terminal, a reference potential terminal, an output terminal, a constant-current source, a higher potential supply terminal, a first lower supply terminal, a second lower potential supply terminal having a potential higher than that of said first lower potential supply terminal, a resistor and a capacitor, said output circuit comprising:
- a first bipolar transistor having a base connected to said input terminal and an emitter connected to said first lower potential supply terminal through said constant-current source;
- a second bipolar transistor having a base connected to said reference potential terminal and an emitter connected said first lower potential supply terminal through said constant-current source;
- a third bipolar transistor having a collector connected to said higher potential supply terminal, an emitter connected to said output terminal, and a base connected to a collector of one of said first and second bipolar transistors;
- a first one-conductivity type MOS transistor having a source connected to said second lower potential supply terminal, and a gate and a drain which are connected commonly to said higher potential supply terminal through said resistor and to a collector of one of said first and second bipolar transistors through said capacitor; and
- a second one-conductivity type MOS transistor having a gate connected to the gate of said first one-conductivity type MOS transistor, a source connected to said second lower potential supply terminal, and a drain connected to the emitter of said third bipolar transistor.

6. An ECL output circuit according to claim 5, in which said first to third bipolar transistors are of an NPN-type, and said first and second one-conductivity type MOS transistors are of an N-type.

* * * * *